United States Patent [19]

Nishimura

[11] Patent Number: 5,073,974
[45] Date of Patent: Dec. 17, 1991

[54] HOT STANDBY TRANSMITTER SWITCHING SYSTEM USING UPPER AND LOWER SIDEBAND WAVES

[75] Inventor: Akira Nishimura, Ohtawara, Japan

[73] Assignee: Fujitsu Limited, Kawasaki, Japan

[21] Appl. No.: 452,359

[22] Filed: Dec. 19, 1989

[30] Foreign Application Priority Data

Dec. 20, 1988 [JP] Japan .................... 63-325044

[51] Int. Cl.⁵ .............................. H04B 1/02
[52] U.S. Cl. .................... 455/103; 455/115
[58] Field of Search ............... 455/103–106, 455/113, 115–116, 119, 109, 302, 317

[56] References Cited

U.S. PATENT DOCUMENTS 3,754,188  8/1973  Wilkens ............... 455/105
4,584,715  4/1986  Baars et al. ........... 455/302
4,723,307  2/1988  Clark et al. ........... 455/103
4,926,500  5/1990  Tsuda et al. ........... 455/302

Primary Examiner—Curtis Kuntz
Assistant Examiner—Andrew Faile
Attorney, Agent, or Firm—Staas & Halsey

[57] ABSTRACT

In a hot standby transmitter system, each of a pair of identical transmitters, one of which is a primary and another one is a standby, includes an image-cancel type mixer, which outputs upper or lower sideband waves of a local frequency, according to its internal connection controlled by a switch controller. The switch controller controls the internal switches and an RF switch, so that the primary transmitter outputs a predetermined primary one of the sidebands and the standby transmitter outputs another sideband. The RF switch selectively connects the output of the primary transmitter to an antenna. The standby transmitter undesirably outputs a small level of the primary sideband even though it should be theoretically zero. This low level primary wave component in the standby transmitter's output allows a reduction in the isolation amount of the RF switch, compared with the high isolation amount required in a prior art method where the standby transmitter outputs the primary wave at a level as high as the primary transmitter level, in order to keep the ratio of the power level from the primary transmitter to the power level from the standby transmitter higher than a predetermined requirement level. The circuit for detecting a fall in the output power is simple compared to the complex circuit required in another prior art method where the standby transmitter outputs the primary wave at a lower signal level than the primary transmitter.

9 Claims, 6 Drawing Sheets

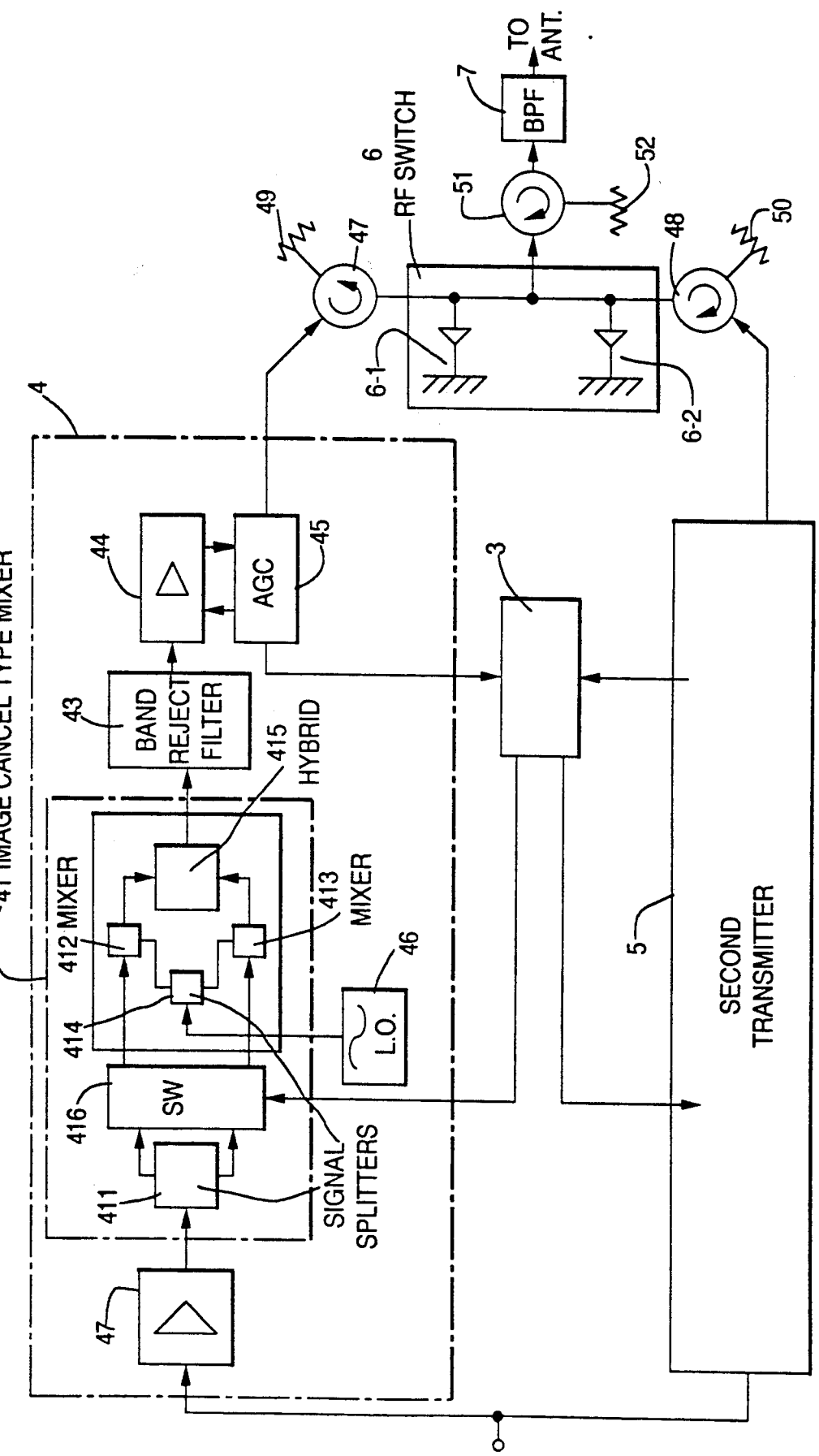

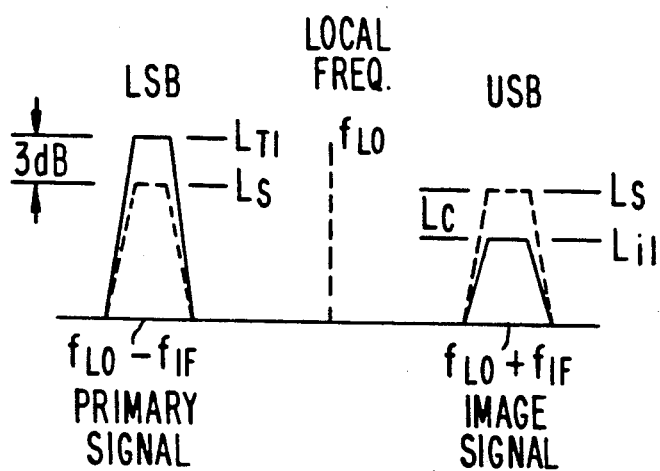
FIG. 5①
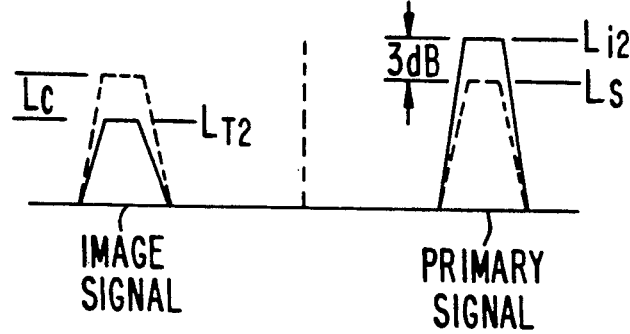
FIG. 5②
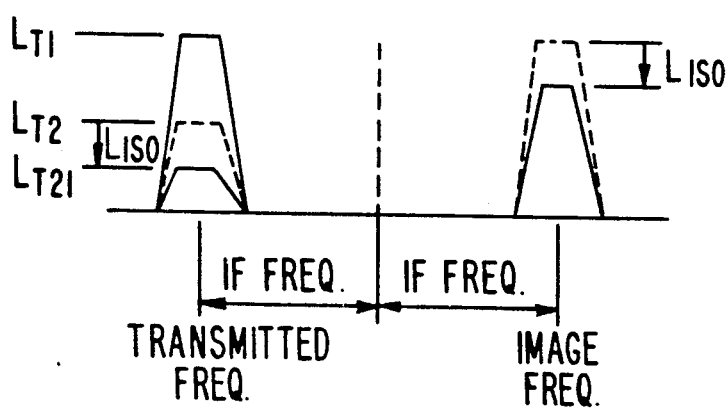
FIG. 5③

HOT STANDBY TRANSMITTER SWITCHING SYSTEM USING UPPER AND LOWER SIDEBAND WAVES

BACKGROUND OF THE INVENTION

1. Field of the Invention

The present invention relates to a system to switch a hot standby auxiliary transmitter in a radio transmitting apparatus.

2. Description of the Related Art

A radio transmitting system is generally provided with an auxiliary transmitter in order to improve the operation reliability of the system. For this auxiliary system, there are two types, i.e. an auxiliary route system and a standby transmitter system. In the latter system, there are further two types. The first one is a hot standby transmitter where, while a primary transmitter is outputting its power, an auxiliary transmitter stands-by with its power source voltage applied thereto so as to keep the auxiliary transmitter operating in order to avoid a drift in its operation characteristics taking place on application of its operating voltage to the standby transmitter. The second one is a cold standby system where the auxiliary transmitter stands-by without being applied with its power source voltage thereto.

A typical prior art hot standby transmitter system is shown in FIG. 1. In the figure, it is assumed now that a #1 transmitter 1 is outputting its power to an antenna, and a #2 transmitter 25 is standing by, as an operating auxiliary transmitter, outputting an equal frequency and an equal power output level to those of #1 transmitter 1. A radio frequency switch 23 for selectively connecting one of the two transmitters to the antenna is then connected to #1 transmitter 1.

In this type of hot standby transmitter system, in the output of the radio frequency switch 23 a ratio D/U (Demand/Unnecessary) of the output power D from the primary transmitter 1 to the power U leaked through the radio frequency switch 23 from the auxiliary transmitter 25 must be more than a predetermined value. If this D/U ratio is small, the power leaked from the auxiliary transmitter deteriorates the characteristics of the output power from the primary transmitter, because the frequency and phase of the outputs of the two transmitters 1 and 25 can not perfectly conform to each other.

Details of the FIG. 1 structure are hereinafter described. The #1 transmitter 1 and #2 transmitter 25 are identically constituted and identically operate. Therefore, explanation of the details of the transmitter is made on the #1 transmitter only.

A baseband signal is input to #1 transmitter 1 and #2 transmitter 25 via a splitter circuit 22. In a modulator 11, an internal frequency of, for example, 70 MHz, is modulated by the input baseband signal. In a mixer 12, the modulated signal from modulator 11 is mixed with a transmitter local oscillation signal, which is generated in a transmitter local oscillator 14, and a radio frequency wave of the transmitter frequency $f_1$, for example, 6 GHz, is output therefrom. This radio frequency signal is amplified by a high power amplifier 13 up to a predetermined level, such as 1 watt, and is input to a radio frequency switch 23. An automatic gain control (AGC) circuit 15 keeps the output level of the amplifier 13 at a predetermined level, and outputs an alarm signal when the output level of the amplifier 13 becomes lower than a predetermined threshold level.

Radio frequency switch 23 is composed of, for example, first and second groups, $D_1$ and $D_2$, of PIN diodes. When radio frequency switch 23 is to connect the #1 transmitter to the antenna, a DC (direct current) current through the first group of PIN diodes $D_1$ are is cut off, and a DC current is applied to the the second group PIN diodes, each controlled by a control signal from a switch control circuit 21. Any unnecessary signal components in the output signal from the radio frequency switch 23 are rejected by a band-pass filter 24. The output of the band-pass filter 24 is delivered to an antenna which is not shown in the figure. On the other hand, the output signal from #2 transmitter 25 is reflected by the second group of PIN diodes $D_2$ in the switch 23 and is absorbed in a dummy load, which is not shown in the figure.

When AGC circuit 15 detects a fall in the output level of amplifier 13, an alarm signal output therefrom triggers switch controller 21. Then, the switch controller 21 outputs the switch control signal to the radio frequency switch 23 so that the diode groups $D_1$ and $D_2$ are switched. That is, the first group of diodes $D_1$ is applied with a DC current and the DC current in the second group of diodes $D_2$ is cut off, so that the output signal of the #2 transmitter passes through the transmitter switch 23, while the output signal of the #1 transmitter is choked by the first group of PIN diodes $D_1$ in the radio frequency switch 24.

Output signal levels from radio frequency switch 23 are determined by its isolation characteristics, because the output levels of the #1 transmitter and #2 transmitter are identical. On the other hand, the D/U ratio of the output signal from the radio frequency switch 23 is required to be, for example, more than 40 db. In order to satisfy this requirement, many expensive PIN diodes, for example, three PIN diodes in the single group, must be used, which causes an increase in the cost of the system.

Furthermore, in order to reduce the cost of the radio frequency switch 23, there may be employed another method wherein the output signal level from the standby transmitter is reduced by a predetermined amount so as to decrease the output level of the radio frequency switch 23. This method is functionally equivalent to an increase in the isolation of the radio frequency switch 23, without increasing the number of the PIN diodes. In this method, a threshold level of the AGC circuit 15 for detecting whether the transmitter is outputting a normal power level must be adjusted when the standby transmitter signal level is reduced. This method requires a complicated circuit configuration of an output level detection circuit in the AGC circuit 15.

In other words, there is a problem in that either the radio frequency switch becomes expensive or the circuit configuration of the output level detection circuit becomes complicated.

SUMMARY OF THE INVENTION

It is an object of the present invention to provide a hot standby transmitter system which employs a less expensive RF switch or a less expensive circuit for detecting a fall in output power.

According to the present invention each of the identical transmitters, one of which is a primary transmitter and another one of which is a standby transmitter, comprises an image-cancel type mixer. The image-cancel type mixer outputs either one of upper or lower sideband waves of a local frequency signal, according to a change of internal connection of the image-cancel type mixer. A transmitter switch controller controls the internal connection and an RF switch selectively connects outputs of the transmitters, so that the primary transmitter outputs a predetermined primary one of the two sideband waves, the standby transmitter outputs another sideband, i.e. an image of the primary wave, and the RF switch selectively connects the output of the primary transmitter to an antenna. The standby transmitter, which has been switched so as to output the image wave, outputs theoretically a zero, but actually a low level of the primary wave, too. The low level primary wave output from the standby transmitter allows a reduction in the isolation amount of the RF switch, while keeping the ratio of the primary sideband level from the primary transmitter to the primary sideband component level from the standby transmitter higher than a predetermined requirement level. Moreover, the circuit for detecting a fall in the transmitter output power level can be simple because of the identical output power levels of the two transmitters.

The above-mentioned features and advantages of the present invention, together with other objects and advantages, which will become apparent, will be more fully described hereinafter, with reference being made to the accompanying drawings which form a part hereof, wherein like numerals refer to like parts throughout.

BRIEF DESCRIPTION OF THE DRAWINGS

FIG. 3 is a block diagram of a preferred embodiment of the present invention;

FIGS. 5①, 5② and 5③ are diagrams of signal levels of the signal measured at the input terminals and at the output terminal of the radio frequency switch.

DESCRIPTION OF THE PREFERRED EMBODIMENTS

Figure 2:
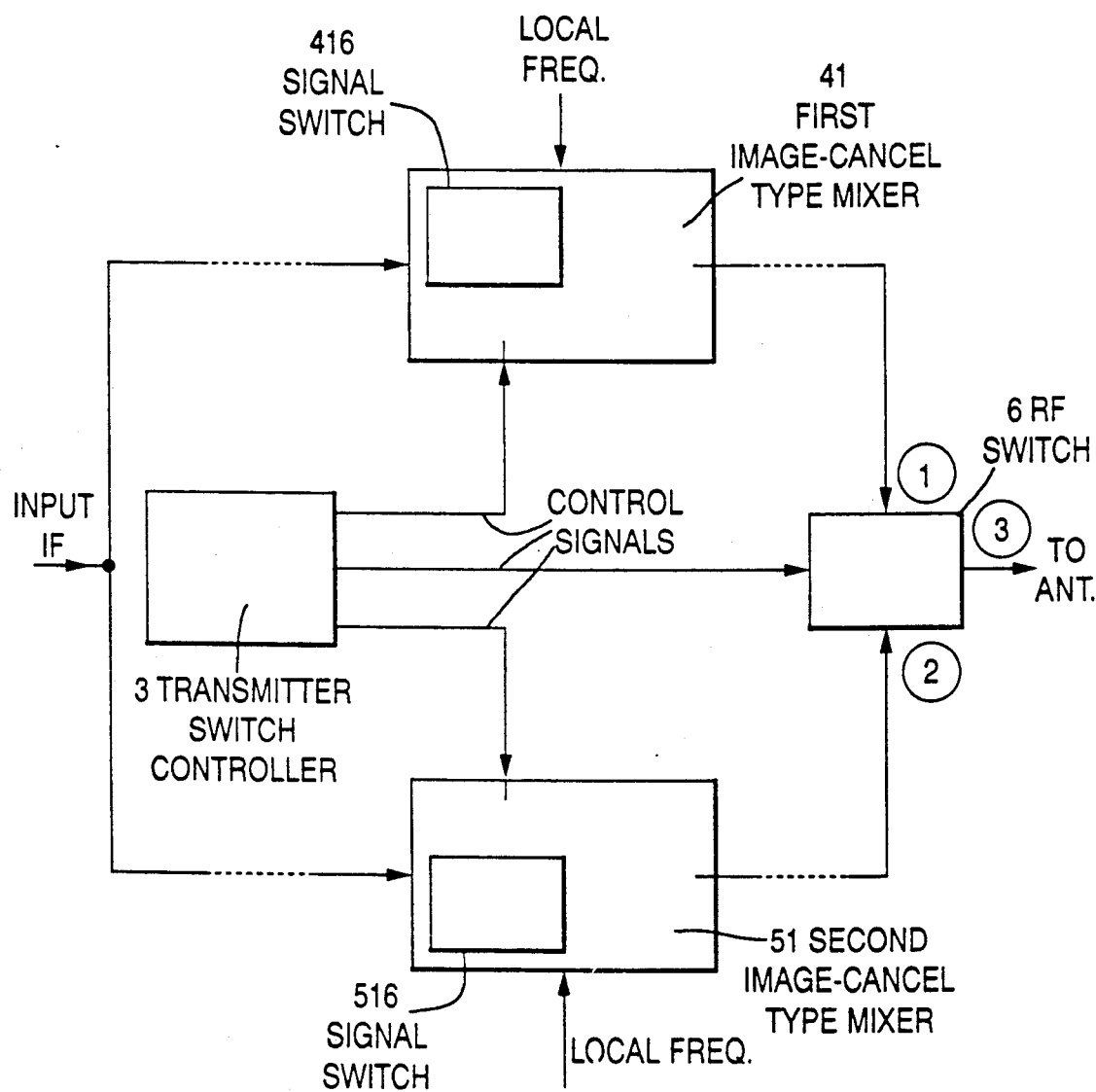
FIG. 2 is a block diagram for explaining the principle of the present invention.

Referring to a block diagram of FIG. 2, the principle of the present invention is explained. The numerals 41 and 51 respectively denote first and second image-cancel type mixers, which are substantially identical to each other. An input signal of an internal frequency $f_{IF}$ (referred to hereinafter as IF) of, for example, 70 MHz, is input to the first image-cancel type mixer 41. A local frequency signal of frequency $f_{LO}$, for example, 6000 MHz, is also input to the image-cancel type mixer 41. The image-cancel type mixer 41 mixes its input signals of frequency $f_{IF}$ and local frequency $f_{LO}$, so as to output an upper sideband wave, i.e. an added frequency $(f_{LO}+f_{IF})=6000$ MHz$+70$ MHz$=6070$ MHz, or a lower sideband wave, i.e. a subtracted frequency $(f_{LO}-f_{IF})=6000$ MHz$-70$ MHz$=5930$ MHz. A signal switch 416 in the image-cancel type mixer 41 selects which of the upper or lower sideband waves the image-cancel type mixer 41 outputs. Configuration and operation of the image-cancel type mixer is described later in detail.

A transmitter switch controller 3 outputs control signals to signal switch 416 and a signal switch 516 in the second image-cancel type mixer 51, and to a radio frequency switch (referred to hereinafter as RF switch) 6. Input terminals ① and ② of RF switch 6 are connected to outputs of the first and second image-cancel type mixers 41 and 51, respectively. An output terminal ③ of RF switch 6 is connected to an antenna, which is not shown in FIG. 2. Control signals output from the transmitter switch controller 3 determine that: the primary one of the image-cancel type mixers 41 (or 51) out of the two image-cancel type mixers outputs a predetermined primary one of the upper or lower side band waves, and the other image-cancel type mixer 51 (or 41), as an auxiliary, i.e a standby, outputs sideband wave other than that of the primary image-cancel type mixer. RF switch 6 selectively connects the output of the primary image-cancel type mixer to the antenna. In other words, the primary wave is output from a primary transmitter to the antenna, and an image of the primary wave is output from the standby transmitter, and then, the transmitter switch controller 3 determines which one is the primary transmitter.

Referring to FIGS. 5①, 5② and 5③ signal levels output from the first and second image-cancel type mixers are hereinafter explained, where it is assumed that the primary first image-cancel type mixer 41 is selected to output the lower sideband wave LSB through RF switch 6 while the standby second image-cancel type mixer 51 is selected to output the higher sideband wave USB, which is the image frequency of the lower sideband LSB.

FIG. 5① shows signal levels measured at an output terminal ① of the first image-cancel type mixer 41. FIG. 5② shows signal levels measured at an output terminal ② of the second image-cancel type mixer 51. FIG. 5③ shows signal levels measured at an output terminal ③ of RF switch 6. In FIGS. 5, dotted lines indicate reference signal levels which do not actually appear at each measuring point, for easy comprehension. In FIGS. 5① and 5②, level $L_{T1}$ of LSB and level $L_{T2}$ of USB are 3 db higher than the output level $L_s$ of local mixers 412 and 413 in the image-cancel type mixer (FIG. 3) because the levels $L_{T1}$ and $L_{T2}$ are respectively the sums of the outputs of first and second mixers 412 and 413 as described below in formulas (3) and (6). Though the residual amount of the image frequency wave USB of the primary image-cancel type mixer should be theoretically zero as described later, there still is some residual image level in the practical circuit structure, as denoted with level $L_{iL}$ in FIG. 5①. That is, level $L_{il}$ of USB is suppressed by the image canceling amount $L_c$, for example, 20 db, down below the mixer output level $L_s$. For this reason, the output of the standby image-cancel type mixer 51 includes its image frequency wave LSB having a level $L_{i2}$.

Figure 1:
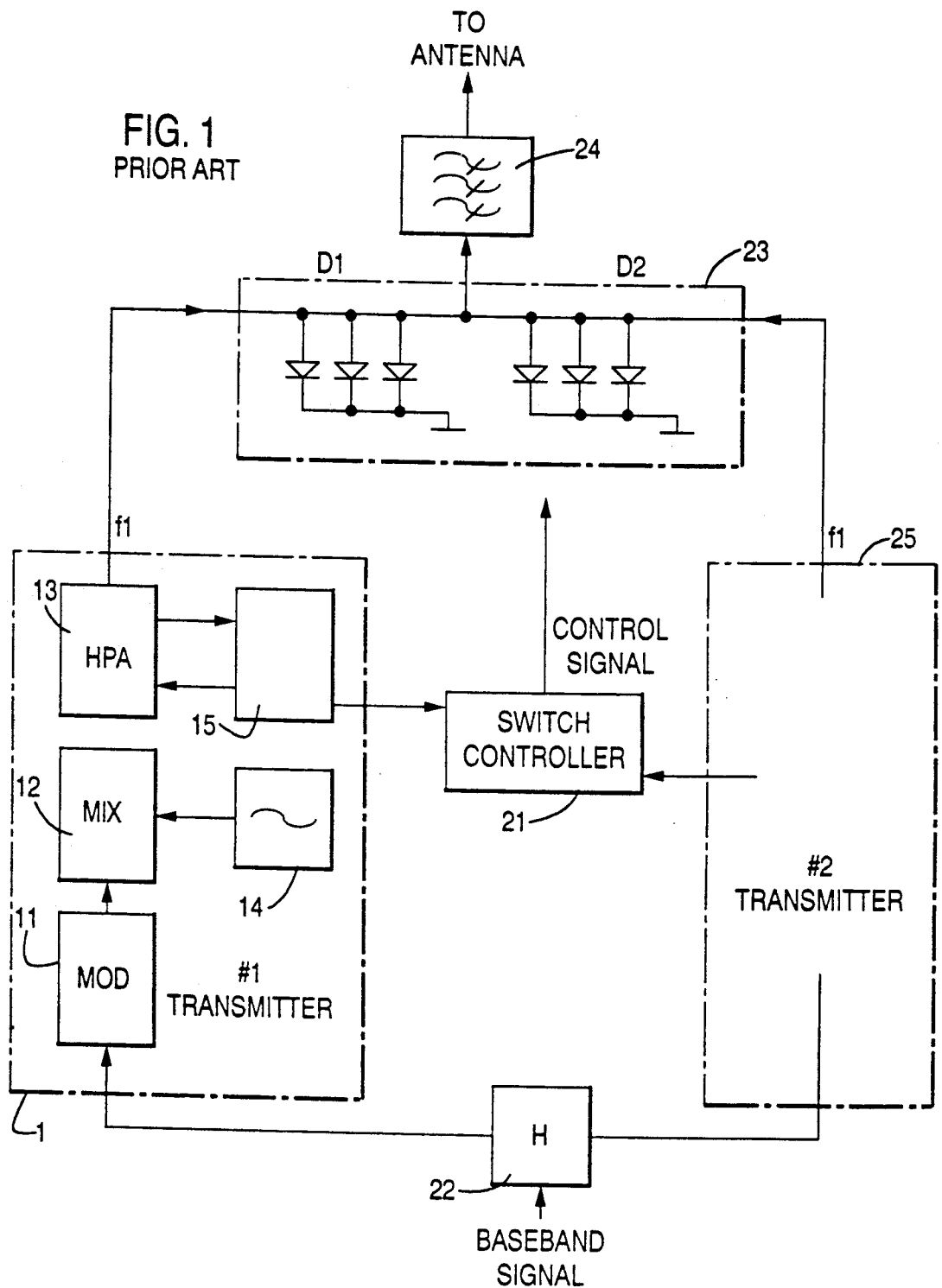
FIG. 1 is a block diagram of a prior art standby transmitter system.

Thus, as seen in FIG. 5②, at the input terminals of the RF switch 6, there appears a desirable wave (D), i.e. LSB in this case, of level $L_{T1}$ from the primary image-cancel type mixer 41 and an unnecessary LSB wave (U) of level $L_{T2}$ from the standby image-cancel type mixer 51. Consequently, the D/U ratio measured at the input terminals of the RF switch becomes $(L_c+3)$ db. The D/U ratio in the prior art configuration shown in FIG. 1 is 0 db, because in prior art FIG. 1 configuration the signal levels of the desired frequency waves measured at the input terminals of the RF switch are equal. This means that the present invention virtually increases the isolation of the RF switch by $(L_c+3)$ db. Therefore, the amount of isolation of RF switch 6 can be less than that of the prior art RF switch 23 by the amount of the virtual isolation increase, $(L_c+3)$ db.

FIG. 5(3) shows an output spectrum of the RF switch 6, where the levels of both the output spectrums LSB and USB from the standby image-cancel type mixer are respectively lowered, below the dotted lines levels $L_{i2}$ and $L_{T2}$ corresponding to the input levels shown in FIG. 5(2), down to the levels $L_{i21}$ and $L_{T21}$ denoted with solid lines, by the isolation amount $L_{ISO}$. Consequently, the final D/U ratio measured at the output of the RF switch becomes $(L_c+3 + L_{ISO})$ db.

Increase in the virtual isolation amount is the same even when the image-cancel type mixers 41 and 51 and the RF switch 6 are switched with each other so that first image-cancel type mixer 41 selects the upper sideband USB output and the second image-cancel type mixer 51 selects the lower sideband LSB, because the first image-cancel type mixer 41 and the second image-cancel type mixer 51 are identical and the RF switch is symmetric.

Referring to a block diagram of FIG. 3, a preferred embodiment of the present invention is hereinafter described in detail. As described above, the second transmitter 5 is identical to the first transmitter 4; therefore, the description of the first transmitter 4 is the same as the description of the second transmitter 5. The first transmitter 4 comprises: a pre-amplifier 47; an image cancel type mixer 41; a band rejection filter 43; a power amplifier 44; an AGC (automatic gain control) circuit 45; and a local frequency oscillator 46. The image-cancel type mixer 41 includes a first signal splitter 411; a signal switch 416; a second signal splitter 414; a first local mixer 412; a second local mixer 413; and a hybrid circuit 415. An IF signal, for example, 70 MHz, modulated with a baseband signal (simply referred to hereinafter as an IF signal) is input to pre-amplifier 47. Functions of the above-described components in the first transmitter 4 are described later in detail. Outputs of the first transmitter 4 and the second transmitter 5 are input to an RF switch 6 via a circulators 47 and 48, respectively. RF switch 6 is controlled by a transmitter switch controller 3 so as to selectively output the proper one of the outputs from the two transmitters as described above to a third circulator 51. An output of third circulator 51 is input to a band pass filter 7. An output of band pass filter 7 is transmitted typically to an antenna which is not shown in the figure.

Figure 4A:
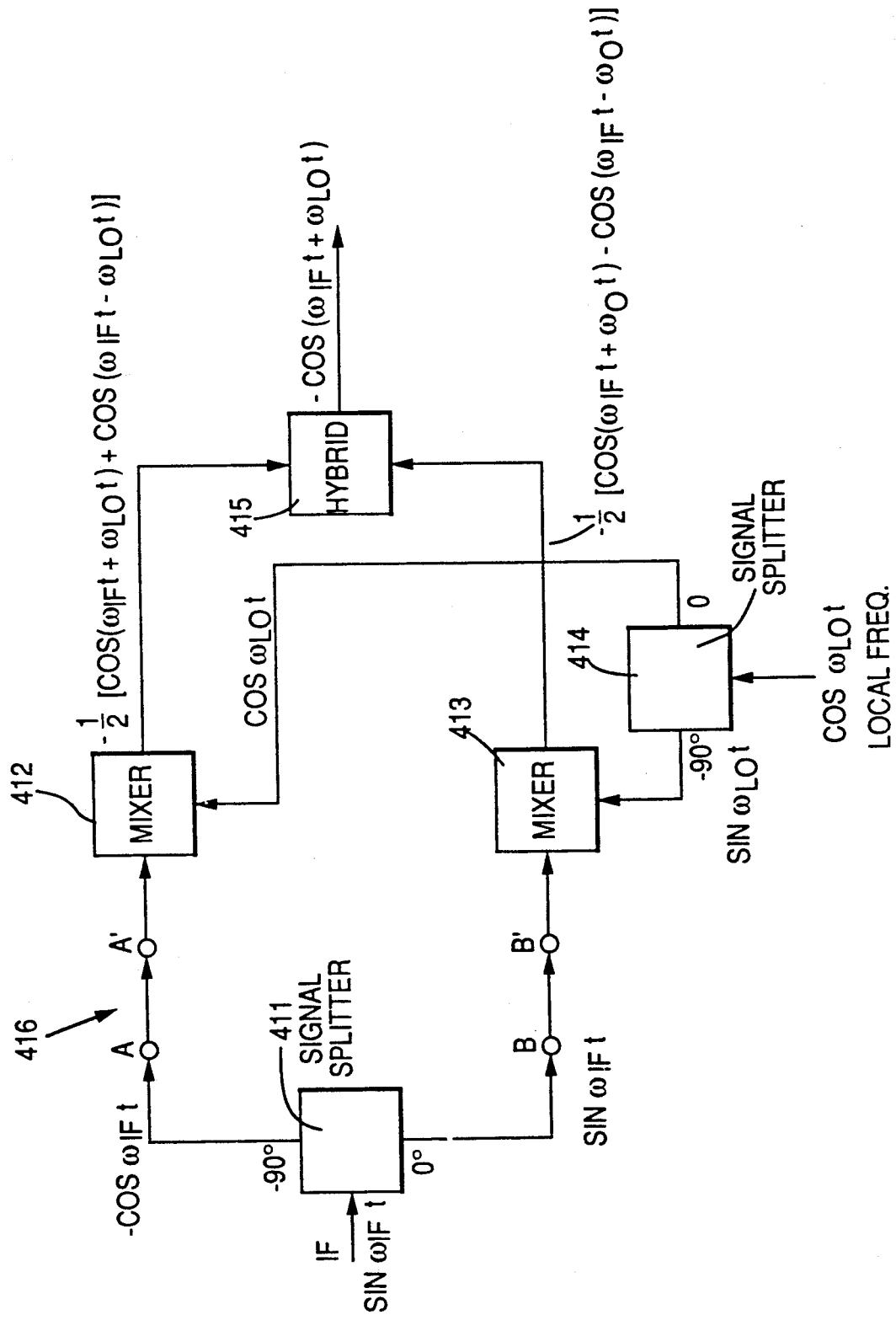
FIGS. 4(a) and 4(b) are block diagram for explaining the function of the image-cancel type mixer having a signal switch therein.
Figure 4B:
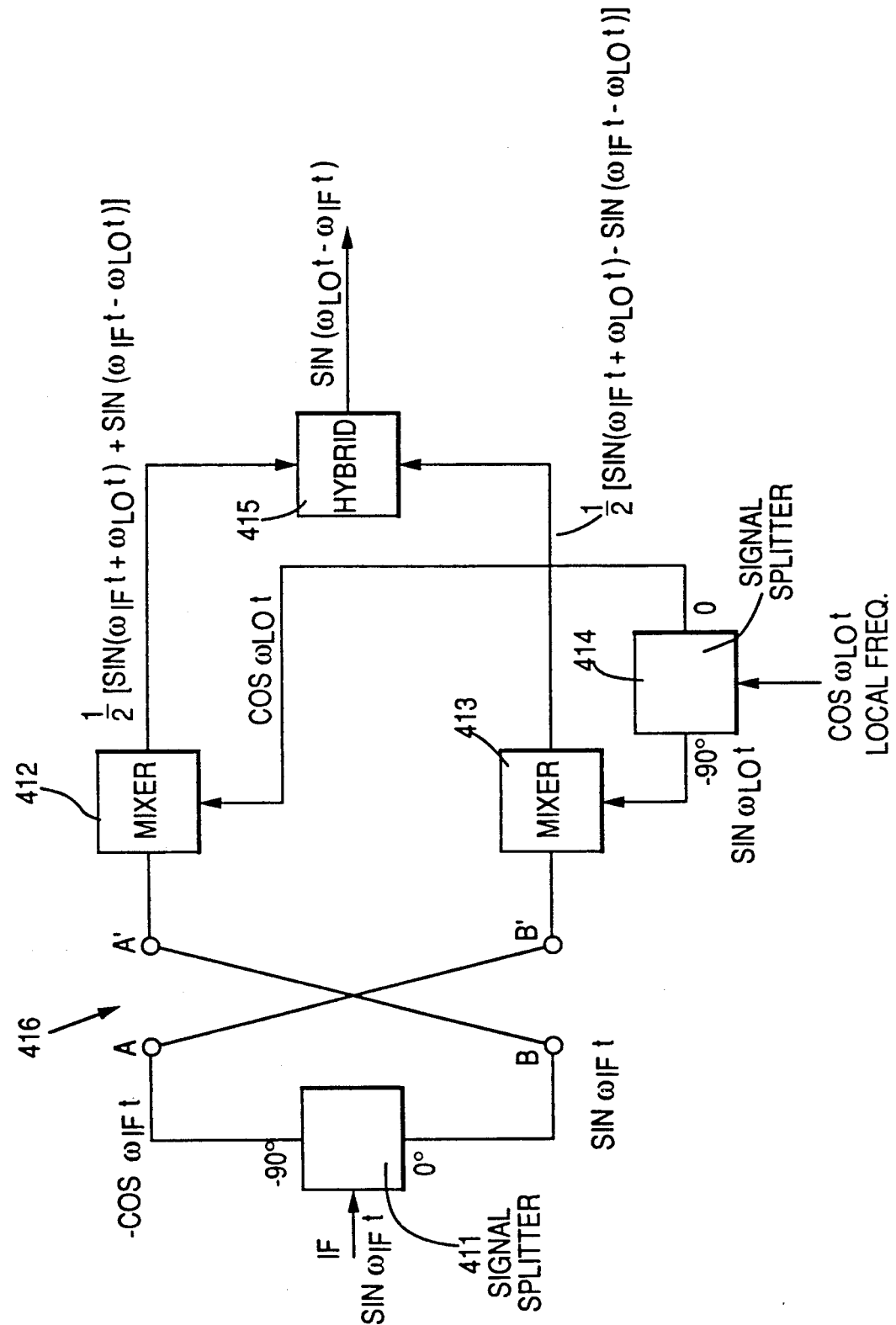

Referring to FIGS. 4(a) and 4(b) the constitution and operation of image-cancel type mixer 41 including signal switch 416 are hereinafter explained. An output signal of pre-amplifier 47 is input to a first 90°-splitter 411. It is now assumed that the input signal to first 90°-splitter 411 is $\sin \omega_{IF} t$, and a local frequency signal input to a second 90°-splitter 414 from the local oscillator is $\cos \omega_{LO} t$. The input signal $\sin F\omega_{IF} t$ is divided by first 90°-splitter 411 into $\sin \omega_{IF} t$ which is, a same phase signal B, and $\cos \omega_{IF} t$, which is 90°-delayed signal A after the input $\sin \omega_{IF} t$. 90°-splitter 411 is widely known and commercially available. Signal switch 416 is a double-pole double-throw switch, which may be composed of semiconductor elements, such as diodes or transistors, according to a widely known technique. In FIG. 4(a) switch 416 is at the position where signal A is connected via terminal A' to the first mixer 412, and signal B is connected via terminal B' to the second mixer 413. Second splitter 414, which is a 90°-splitter is widely known and commercially available, and divides the 6000 MHz input local frequency signal and outputs a same-phase local frequency signal, $\cos \omega_{LO} t$, to first mixer 412 and a 90°-delayed local frequency signal, $\sin \omega_{LO} t$, to second mixer 413.

When the first and second mixers 412 and 413 are respectively input with the above-described signals, first mixer 412 outputs:

$$-\tfrac{1}{2}[\cos(\omega_{IF} t + \omega_{LO} t) + \cos(\omega_{IF} t - \omega_{LO} t)] \quad (1)$$

and second mixer 413 outputs:

$$-\tfrac{1}{2}[\cos(\omega_{IF} t + \omega_{LO} t) - \cos(\omega_{IF} t - \omega_{LO} t)] \quad (2)$$

These two signals are summed in a co-phase hybrid circuit 415, which then outputs:

$$-\cos(\omega_{LO} t + \omega_{IF} t) \quad (3)$$

This is an upper side band wave USB of the local frequency $f_0$ and includes none of the lower sideband wave LSB, $\cos(\omega_{LO} - \omega_{IF} t)$, which is an image frequency of the first transmitter 4. Therefore, this type of mixer circuit is called an image-cancel type mixer. The co-phase hybrid circuit 415 is well-known and commercially available.

Next, when the connection of signal switch 416 is switched as shown in FIG. 4(b), where signal A is connected to terminal B', and signal B to terminal A', first mixer 412 outputs:

$$\tfrac{1}{2}[\sin(\omega_{IF} t + \omega_{LO} t) - + \sin(\omega_{IF} t - \omega_{LO} t)] \quad (4)$$

and second mixer 413 outputs:

$$\tfrac{1}{2}[\sin(\omega_{IF} t + \omega_{LO} t) + [\sin(\omega_{IF} 5 - \omega_{LO} t)] \quad (5)$$

Then, co-phase hybrid circuit 416 outputs:

$$\sin(\omega_{LO} t - \omega_{IF} t) \quad (6)$$

This is a lower sideband wave LSB of the local frequency $f_0$ and includes none of the upper sideband USB, $\sin(\omega_{LO} t + \omega_{IF} t)$.

Thus, according to the status of signal switch 416 the output frequency of the image-cancel type mixer, i.e. the output of the transmitter, is switched to the proper one of the upper or lower sideband.

A band reject filter 43 rejects local frequency component $f_0$ undesirably included in the output of the image-cancel type mixer 41. Power amplifier 44 amplifies the output of the bandreject filter 43, including the primary lower sideband and some undesirably remaining upper sideband USB, up to, for example, 1 watt.

RF switch 6 typically comprises first and second PIN diodes 6-1 and 6-2, connected to shunt the respective transmission lines coming in from first transmitter 4 and second transmitter 5. When a reverse DC voltage ia applied to first PIN diode 6-1, the PIN diode does not disturb the signal from first transmitter 4 to transmit through RF switch 6. Then, a DC current is applied to second PIN diode 6-2 so that the signal from second transmitter 5 is reflected by the second PIN diode 6 2. The reflected signal power is absorbed by a dummy load 50 connected to a second circulator 48, which is connected between the second transmitter 5 and RF switch 6 and is widely known and commercially available. When RF switch 6 is switched so as to reflect the power from first transmitter 4, the reflected power is absorbed by a dummy load 49 connected to a first circulator 47 connected between first transmitter 4 and RF switch 6. RF switch 6 which has only a single PIN diode in each input line, can provide an isolation amount $L_{ISO}$ of typically 20 db. at 6 GHz. Therefore, the D/U ratio $(L_c+3+L_{ISO})$ db measured in the output terminal of RF switch 6 achieves typically 20+3+20=43 db, which is adequate to satisfy the requirement of 40 db.

RF switch 6 which uses only a single PIN diode in each input line, thus replaces expensive prior art RF switch 23 using as any as two PIN diodes in each input line, and contributes to reduction of the cost of a hot standby transmitter system.

AGC circuit 45 is of a widely known circuit for controlling the output level of amplifier 45 at a predetermined level, 1 watt, and also detects a fall in the output power level caused typically from a fault of the transmitter. When the AGC circuit 45 detects that the output level of the primary transmitter, i.e. of the first transmitter 4 in this case, becomes lower than a predetermined threshold level, a signal, as an alarm, is output therefrom to transmitter switch controller 3. Then, transmitter switch controller 3 confirms that no alarm is received from an AGC circuit (not shown in the figure) in the standby transmitter, i.e. the second transmitter 5 in this case, and transmits switch control signals to the first transmitter 4 so as to select upper sideband wave USB, to the second transmitter 5 so as to select the lower sideband wave LSB, and to RF switch 6 so as to allow the signal output from the second transmitter 5 to pass therethrough and reflect the signal output from the first transmitter 4. Then, the lower and upper sideband waves, LSB and USB, respectively transmitted from the second transmitter and the first transmitter are substantially identical to those of the previous switch state.

Though in the above-described preferred embodiment a local frequency oscillator is provided in each transmitter, the local frequency signal may be supplied from an oscillator located outside the transmitter.

Though in the above-described preferred embodiment a single PIN diode is employed for each input line of the RF switch 6, it is apparent that the quantity of the PIN diodes may be increased according to the isolation requirement. When a plurality of PIN diodes are employed, the PIN diodes are preferably located in a quarter wavelength pitch.

Though in the above-described preferred embodiment the switching of the transmitter are carried out according to signal detection of a fall in the output power of the amplifier, it is apparent that the transmitter switching may be carried out according to a manual instruction.

Though in the above-described preferred embodiment the RF switch is composed of PIN diodes, it is apparent that the present invention may be embodied in a system employing other types of RF switches which do not employ PIN diodes.

The advantageous effects of the present invention are summarized as follows: Compared with the high isolation amount required in a prior art method where the standby transmitter outputs the primary wave at a level as high as the primary transmitter level, the low level primary wave component in the standby transmitter's output allows a reduction in the isolation amount of the RF switch, while keeping the ratio of the signal level from the primary transmitter to the signal level from the standby transmitter higher than a predetermined requirement level. While a complex circuit for detecting a fall in the output power level is required in another prior art method where the standby transmitter outputs the primary wave at a lower signal level than the primary transmitter, the circuit can be simple in the present invention.

The many features and advantages of the invention are apparent from the detailed specification and thus, it is intended by the appended claims to cover all such features and advantages of the system which fall within the true spirit and scope of the invention. Further, since numerous modifications and changes may readily occur to those skilled in the art, it is not desired to limit the invention to the exact construction and operation shown and described, and accordingly, all suitable modifications and equivalents may be resorted to, falling within the scope of the invention.

What I claim is:

1. A hot standby transmitter switching system of a radio transmitting apparatus, comprising:

a first transmitter and a second transmitter, each including an image-cancel type mixer for mixing a local frequency and a signal frequency and for outputting a radio frequency wave selected from an upper sideband wave and a lower sideband wave of the local frequency, each of said first and second transmitters outputting, an as output wave, the radio frequency wave output by the corresponding one of said image-cancel type mixers respectively installed therein, each of said image-cancel type mixers having a signal switch therein for determining whether the upper or lower sideband wave is to be output from said image-cancel type mixer;

a switch controller, coupled to said signal switches, for outputting control signals to each of said signal switches, so that said second transmitter selectively outputs one of the sideband waves which is different from that which said first transmitter outputs; and a radio frequency switch, coupled to said switch controller and said first and second transmitters and controlled by said switch controller, for selectively outputting the output wave from the one of said first and second transmitters which outputs a predetermined one of the upper and lower sideband waves, so that, while one of said first and second transmitters is outputting the predetermined one of the upper and lower sideband waves, the other of said first and second transmitters acts as a standby transmitter by outputting the other of the upper and lower sideband waves.

2. A hot standby transmitter switching system as recited in claim 1, wherein each of said image-cancel type mixers further comprises:

a first 90° signal-splitter for receiving a first input signal on an internal frequency carrier, and outputting a first signal which is 90°delayed from the first input signal and a second signal of the same phase as the first input signal;

a second 90° signal-splitter for receiving a local frequency signal, and outputting a first local frequency signal of the same phase as the local frequency signal and a second local frequency signal which is 90° delayed from the local frequency signal;

a first mixer for receiving the first or second signal and the first local frequency signal, and for outputting a first mixed signal;

a second mixer for receiving the second or first signal and the second local frequency signal, and for outputting a second mixed signal; and a hybrid circuit for combining the first mixed signal and the second mixed signal, and for outputting one of a lower sideband and an upper sideband of said local frequency signal according to connection of said first and second signals to said first and second mixers.

3. A hot standby transmitter switching system as recited in claim 1, wherein each of said first and second transmitters further comprises:

an AGC circuit, coupled to said switch controller and coupled to receive the output wave, for detecting a fall in output power level of the output wave and outputting a signal to switch said switch controller.

4. A hot standby transmitter switching system as recited in claim 3, wherein said fall in output power is detected by comparing the output power level with a predetermined threshold level.

5. A hot standby transmitter switching system as recited in claim 4, wherein said fall in output power is caused by a malfunction in the corresponding one of said first and second transmitters.

6. A hot standby transmitter switching system as recited in claim 1, wherein each of said first and second transmitters further comprises a local frequency signal generator, coupled to said image-cancel type mixer, for outputting the local frequency signal.

7. A hot standby transmitter switching system as recited in claim 1, wherein each of said first and second transmitters is for multi-channel radio transmission.

8. A hot standby transmitter switching system as recited in claim 1, wherein said radio frequency switch is composed of PIN diodes.

9. A hot standby transmitter switching system of a radio transmitting apparatus, comprising:

a first transmitter having a first image-cancel type mixer for mixing a local frequency and a signal frequency and for outputting, as a first radio frequency output, a selected one of upper and lower sideband waves of the local frequency;

a second transmitter including a second image-cancel type mixer for mixing the local frequency and the signal frequency and for outputting, as a second radio frequency output, a selected one of the upper and lower sideband waves of the local frequency;

a controller, coupled to said first and second transmitters, for outputting a first control signal to said first transmitter, for outputting a second control signal to said second transmitter and for outputting a third control signal, the first control signal identifying one of the first and second sideband waves of the local frequency and the second control signal identifying the other of the first and second sideband waves of the local frequency; and a switch, coupled to said controller and said first and second transmitters, for selectively outputting, as a primary output, the first radio frequency output or the second radio frequency output in dependence upon the third control signal from said controller, so that a radio frequency output of one of said first and second transmitters is provided as a primary output, and the other of said first and second transmitters acts as a standby transmitter by outputting a radio frequency wave different from the primary output.

* * * * *

UNITED STATES PATENT AND TRADEMARK OFFICE
CERTIFICATE OF CORRECTION

PATENT NO. : 5,073,974
DATED : DECEMBER 17, 1991
INVENTOR(S) : AKIRA NISHIMURA

It is certified that error appears in the above-identified patent and that said Letters Patent is hereby corrected as shown below:

Col. 2, line 5, "190 1" should be --#1--;

line 7, "FIN" should be --PIN--; and line 7, "are" should be --is--;

line 8, "group" should be --group of--;

line 25, "applied" should be --supplied--.

Col. 3, line 13, "outputs" should be --outputs a--;

Col. 4, line 49, "$L_{iL}$" should be --$L_{il}$--.

Col. 5, line 11, "$L_{ISO}{}^{db}$" should be --$L_{ISO})^{db}$--;

line 40, "a" should be deleted;

line 55, "$\sin F\omega_{IF}{}^{t}$" should be --$\sin\omega_{IF}{}^{t}$--.

UNITED STATES PATENT AND TRADEMARK OFFICE
CERTIFICATE OF CORRECTION

PATENT NO. : 5,073,974  Page 2 of 3
DATED : DECEMBER 17, 1991
INVENTOR(S) : AKIRA NISHIMURA It is certified that error appears in the above-identified patent and that said Letters Patent is hereby corrected as shown below:

Col. 6, line 8, "$\cos(\omega_{LF}t - \omega_{LO}t)$" should be $--\cos(\omega_{IF}t - \omega_{LO}t)]--;$ line 11, after ")" (last occurrence) insert --]--;

line 28, "-+sin" should be --+sin--; and line 28, "$\omega_{LO}t)$" (second occurrence) should be $--\omega_{LO}t)]--;$ line 31, "+[sin" should be -- -[sin--; and "$(\omega_{IF}^5 - \omega_{LO}t)$" should be $--(\omega_{IF}t - \omega_{LO}t)]--;$ line 55, "62." should be --6-2.--.

Col. 7, line 8, "of" should be deleted.

UNITED STATES PATENT AND TRADEMARK OFFICE
CERTIFICATE OF CORRECTION

PATENT NO. : 5,073,974                                     Page 3 of 3

DATED      : December 17, 1991

INVENTOR(S) : Akira Nishimura

It is certified that error appears in the above-identified patent and that said Letters Patent is hereby corrected as shown below:

Column 5, line 55, delete the comma after "is".

Signed and Sealed this

Second Day of March, 1993

Attest:

STEPHEN G. KUNIN

*Attesting Officer*        *Acting Commissioner of Patents and Trademarks*